United States Patent [19]

Shinjo

[11] Patent Number: 5,392,298
[45] Date of Patent: Feb. 21, 1995

[54] TESTING APPARATUS FOR EXACTLY DISCRIMINATING DEFECTIVE PRODUCT FROM ACCEPTABLE PRODUCT AND TESTING METHOD USED THEREIN

[75] Inventor: Keisuke Shinjo, Tokyo, Japan

[73] Assignee: NEC Corporation, Tokyo, Japan

[21] Appl. No.: 912,758

[22] Filed: Jul. 13, 1992

[30] Foreign Application Priority Data

Jul. 11, 1991 [JP] Japan .................................. 3-170824

[51] Int. Cl.⁶ .............................................. G06F 11/16
[52] U.S. Cl. .................................. 371/25.1; 371/68.1;
371/36; 371/22.1
[58] Field of Search .................. 371/25.1, 68.1, 36,
371/22.1

[56] References Cited

U.S. PATENT DOCUMENTS

| | | | |
|---|---|---|---|
| 4,015,246 | 3/1977 | Hopkins, Jr. et al. ................ | 371/36 |
| 4,801,870 | 1/1989 | Eichelberger et al. ............. | 371/25.1 |
| 4,843,608 | 6/1989 | Fu et al. ................................. | 371/68.1 |
| 4,924,467 | 5/1990 | Criswell ............................... | 371/68.1 |
| 4,942,576 | 7/1990 | Busack et al. ....................... | 371/25.1 |
| 4,943,969 | 7/1990 | Criswell ............................... | 371/68.1 |
| 5,228,042 | 7/1993 | Gauthier et al. .................... | 371/25.1 |

*Primary Examiner*—Emanuel T. Voeltz
*Assistant Examiner*—Hal D. Wachsman
*Attorney, Agent, or Firm*—Sughrue, Mion, Zinn, Macpeak & Seas

[57] ABSTRACT

First random test patterns and a second random test pattern having a "don't care" bit pattern are sequentially supplied to a suspect logic gate as well as to two known good logic gates, the second random test pattern is discriminated when the two known good logic gates produce different output signals due to the "don't care" bit pattern, and a comparator can compare the output signal of the suspect logic gate with the output signal of either known good logic gate only when the first random test patterns are distributed thereto, thereby preventing an analyst from mis-judge on the basis of inconsistency due to the second random test pattern.

4 Claims, 3 Drawing Sheets

TESTING APPARATUS FOR EXACTLY DISCRIMINATING DEFECTIVE PRODUCT FROM ACCEPTABLE PRODUCT AND TESTING METHOD USED THEREIN

FIELD OF THE INVENTION

This invention relates to a testing apparatus for a logic gate and, more particularly, to a testing apparatus using random test patterns.

DESCRIPTION OF THE RELATED ART

Referring first to FIG. 1 of the drawings, a testing apparatus comprises a pattern generating unit 1, a pattern distributing unit 2, adapters 3a and 3b for an objective logic gate 4a and known good logic gate 4b, a comparing unit 5 and a diagnosis unit 6. The pattern generating unit 1 produces an output signal S1 indicative of random test patterns, and the pattern distributing unit 2 distributes output signals S2a and S2b indicative of the random test patterns through the adapters 3a and 3b to the objective logic gate 4a as well as to the known good logic gate 4b. The comparing unit 5 compares the output signals S3a of the objective logic gate 4a with the output signals S3b of the known good logic gate 4b, and produces an output signal S4 indicative of consistency or inconsistency therebetween. The output signal S4 is supplied to the diagnosis unit 6, and the diagnosis unit 6 produces an output signal S5 indicative of an acceptable product in so far as the output signal S4 indicative of inconsistency has not been supplied thereto over the testing sequence.

The testing sequence starts with preparation of the objective logic gate 4a and the known good logic gate 4b, and the known good logic gate 4b has been already qualified. However, the objective logic gate 4a is subjected to the testing sequence to see whether or not it is acceptable. The objective logic gate 4a is coupled with the adapter 3a, and the known good logic gate 4b is coupled with the adapter 3b. The pattern generating unit 1 sequentially produces the random test patterns, and the output signal S1 carries the random test patterns to the pattern distributing unit 2. The pattern distributing unit 2 duplicates the random test patterns, and sequentially supplies the random test patterns to the adapters 3a and 3b. Then, each random test pattern is applied through the adapters 3a and 3b to the objective logic gate 4a and to the known good logic gate 4b. If the objective logic gate 4a is acceptable, the output data of the objective logic gate 4a must be identical with the output data of the known good logic gate 4b. For this reason, the comparing unit 5 compares the output signal S3a with the output signal S3b to see if or not the output data therefrom are consistent with one another. If the output data of the objective logic gate 4a are consistent with the output data of the known good logic gate 4b, the comparing unit 5 supplies the output signal S4 indicative of consistency to the diagnosis unit 6. The prior art testing apparatus repeats the distribution stage to the diagnosis stage for all of the random test patterns, and the diagnosis unit 6 finally produces the output signal S5 indicative of acceptable product upon completion of the testing sequence without the output signal S4 indicative of inconsistency. However, if the output data for a random test pattern are inconsistent with one another, the diagnosis unit 6 does not produce the output signal S5, and the objective logic gate is discarded as a defective product.

Some random test patterns are unique, and the output data produced therefrom can take either logic level. Such arbitrary output data should be treated as "DON'T CARE" pattern and, accordingly, ignored in the comparing unit 5. However, the prior art testing apparatus can not discriminate arbitrary output data from error data indicative of defective product, and acceptable products are liable to be discarded as the defective product.

SUMMARY OF THE INVENTION

It is therefore an important object of the present invention provide a testing apparatus which exactly discriminates a defective product from an acceptable product.

It is another important object of the present invention which provides a testing method which allows the testing apparatus to exactly discriminate a defective product from an acceptable product.

To accomplish the object, the present invention proposes to discriminate a random test pattern having a "don't care" bit pattern when output signals from at least two known good integrated circuits are inconsistent with each other.

In accordance with one aspect of the present invention, there is provided a testing apparatus used for discriminating a defective integrated circuit from an known good integrated circuit, comprising: a) a pattern generating unit operative to sequentially produce first random test patterns and at least one second random test pattern having a "don't care" bit pattern; b) distributing unit coupled with at least first, second and third test adapters which in turn are coupled with first and second known good integrated circuits and a suspect integrated circuit, respectively, the distributing unit being operative to sequentially transfer the first random test patterns and the at least one second random test pattern to the at least first, second and third test adapters so that the first and second known good integrated circuits and the suspect integrated circuit respectively produce first, second and third output signals; c) a logic unit coupled with the first and second test adapters, and producing an enable signal indicative of application of each of the first random test patterns to the first and second known good integrated circuits as well as to the suspect integrated circuit when the first and second output signals are consistent with each other, the logic unit further producing a fourth output signal identical with one of the first and second output signals in the presence of the enable signal; d) a comparator unit operative to compare the third output signal with-the fourth output signal in the presence of the enable signal for producing a fifth output signal indicative of consistency or inconsistency between the third and fourth output signals depending upon result of comparison; and e) a diagnosis unit producing a diagnosis signal indicative of an acceptable integrated circuit if the fifth output signal is indicative of the consistency when all of the first random test patterns result in the fifth output signal indicative of the consistency.

In accordance with another aspect of the present invention, there is provided a testing apparatus used for discriminating a defective integrated circuit from an acceptable integrated circuit, comprising: a) a pattern generating unit operative to sequentially produce first random test patterns and at least one second random test pattern having a "don't care" bit pattern; b) distributing unit coupled with first, second, third and fourth test adapters which in turn are coupled with first, second and third known good integrated circuits and a suspect integrated circuit, respectively, the distributing unit being operative to sequentially transfer the first random test patterns and the at least one second random test pattern to the first, second, third and fourth test adapters so that the first, second and third known good integrated circuits and the suspect integrated circuit respectively produce first, second, third and fourth output signals; c) a logic unit coupled with the first, second and third test adapters, and producing a fifth output signal through a decision by majority on the first, second and third output signals; d) a comparator unit operative to compare the fourth output signal with the fifth output signal for producing a sixth output signal indicative of consistency or inconsistency between the fourth and fifth output signals depending upon result of comparison; and e) a diagnosis unit producing a diagnosis signal indicative of an acceptable integrated circuit if the sixth output signal is indicative of the consistency when all of the first random test patterns result in the sixth output signal indicative of the consistency.

In accordance with yet another aspect of the present invention, there is provided a method of testing an integrated circuit to see whether or not the integrated circuit is either defective or acceptable, comprising the steps of: a) preparing at least first and second known good integrated circuits and a suspect integrated circuit; b) supplying one of a test pattern selected from the group consisting of first random test patterns and at least one second random test pattern having a "don't care" bit pattern to the at least first and second known good integrated circuits as well as to the suspect integrated circuit for producing first, second and third output signals; c) comparing the first output signal with the second output signal to see whether or not the first and second output signals are consistent with each other; d) producing an enable signal when the first and second output signals are consistent with each other; e) comparing the third output signal with a reference signal identical with either first or second output signal in the presence of the enable signal; f) producing a resultant signal indicative of consistency or inconsistency between the third output signal and the reference signal depending upon result of comparison; g) repeating the steps b) to f) until all of the first random test patterns and the at least one second test pattern are supplied to the first and second known good integrated circuits and the suspect integrated circuit; and h) determining the suspect integrated circuit to be known good if the resultant signal is produced to all of the first random test patterns.

BRIEF DESCRIPTION OF THE DRAWINGS

The feature and advantages of the testing apparatus and the testing method used therein according to the present invention will be more clearly understood from the following description taken in conjunction with the accompanying drawings in which.

DESCRIPTION OF THE PREFERRED EMBODIMENTS

First Embodiment

Figure 1:
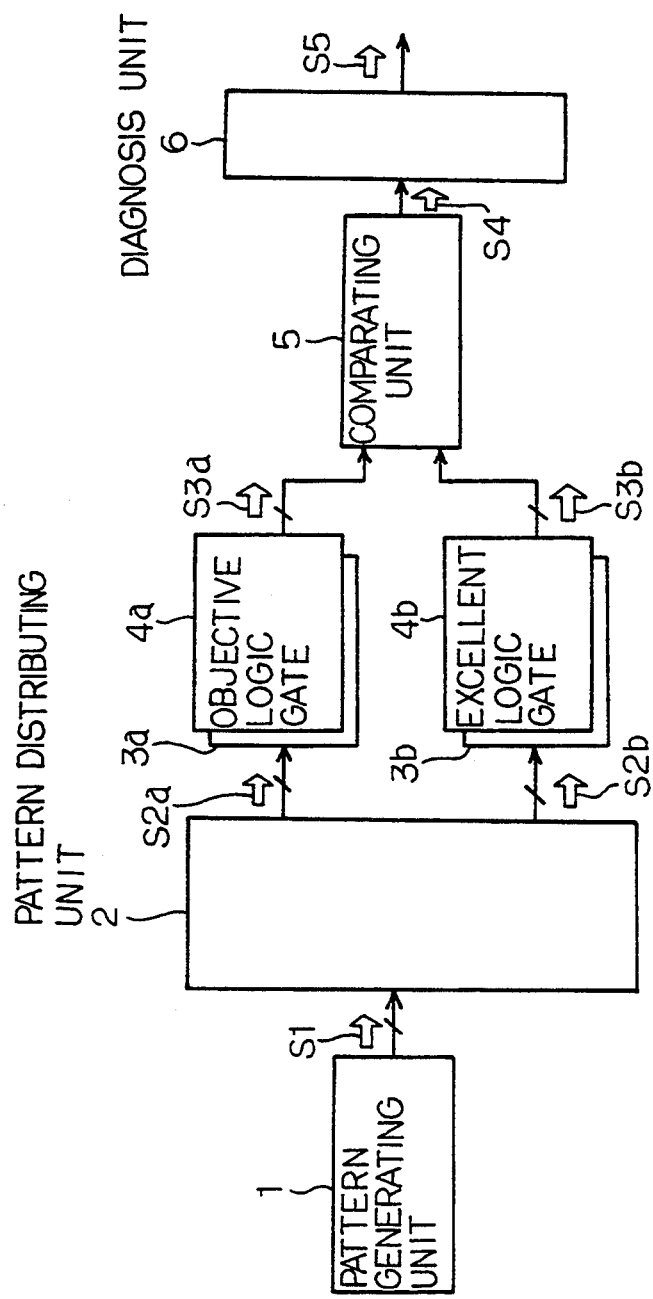
FIG. 1 is a block diagram showing the arrangement of the prior art testing apparatus.
Figure 2:
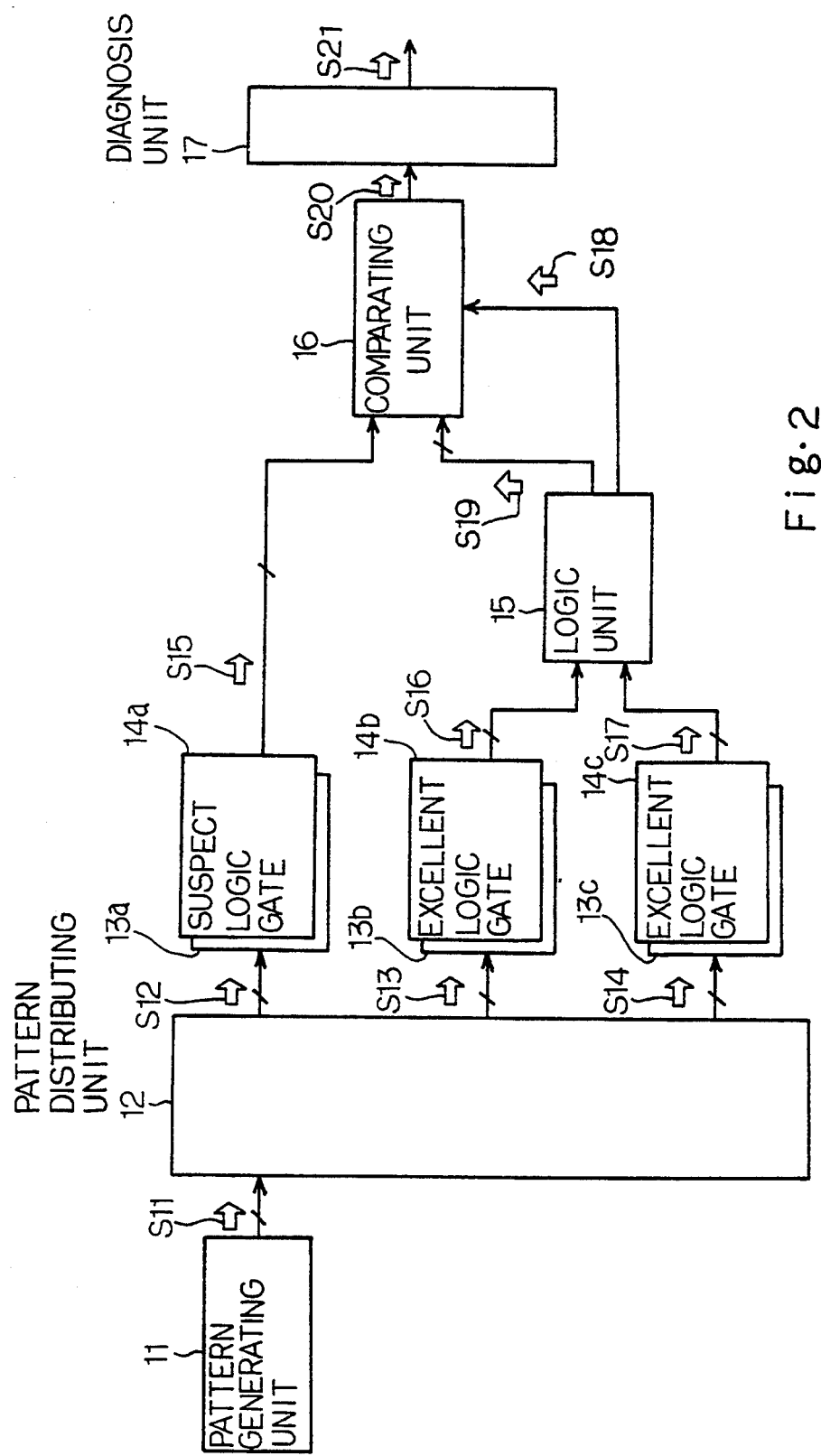
FIG. 2 is a block diagram showing the arrangement of a testing apparatus according to the present invention.

Referring to FIG. 2 of the drawings, a testing apparatus embodying the present invention comprises a pattern generating unit 11, a pattern distributing unit 12, test adapters 13a, 13b and 13c respectively coupled with a suspect logic gate 14a and two known good logic gates 14b and 14c, a logic unit 15 coupled with the test adapters 13b and 13c, a comparing unit 16 coupled with the test adapter 13a and with the logic unit 15, and a diagnosis unit 17 coupled with the comparing unit 16.

The pattern generating unit 11 sequentially produces first random test patterns with uniqueness and at least one second random test pattern having a "don't care" bit pattern, and supplies a multi-bit test pattern signal S11 sequentially indicative of the first and second random test patterns to the pattern distributing unit 12. If a multi-bit test pattern signal S11 indicative of a first random test pattern is supplied to a known good logic gate, the logic gate produces a multi-bit output signal consisting of output data bits, and each of the output data bits is in predetermined logic level. Even though the first random test pattern is supplied to another known good logic gate, the multi-bit output signal thereof is consistent with the multi-bit output signal of the previous known good logic gate because of the consistency of the first random test pattern. However, if a second random test pattern is supplied to two known good logic gate, the multi-bit output signals may be consistent with each other. However, these multi-bit output signals produced from the second random test pattern are usually inconsistent with each other. Thus, the consistency affects the relationship between an input signal and an output signal of a logic gate, and causes the input signal to result in a predetermined output signal.

The pattern distributing unit 12 duplicates the multi-bit test pattern signal S11 twice, and supplies multi-bit test pattern signals S12, S13 and S14 indicative of the random test pattern produced by the pattern generating unit 11 through the test adapters 13a to 13c to the suspect logic gate 14a as well as to the known good logic gates 14b and 14c. Therefore, one of the first random test patterns and the second random test pattern is simultaneously distributed to the suspect logic gate 14a as well as to the known good logic gate 13b and 13c. In the following description, a known good logic gate means that the logical function thereof is known to be acceptable, and a suspect logic gate has not been determined whether to be excellent or defective. With the multi-bit test pattern signals S12 to S14, the suspect and known good logic gates 14a to 14c respectively produce multi-bit output signals S15, S16 and S17 produced through the logical function.

Though not shown in the drawings in detail, the logic unit 15 has a comparing circuit and a driving circuit. The comparative circuit compares the component bits of the multi-bit output signal S16 with the component bits of the multi-bit output signal S17 to see whether or not inconsistency takes place therebetween, and is, by way of example, implemented by an array of exclusive-OR gates. If the multi-bit output signal S16 is consistent with the multi-bit output signal S17, the comparing circuit and, accordingly, the logic unit 15 produce an enable signal S18 indicative of consistency therebetween, and the enable signal is supplied to the comparing unit 16. The driving circuit produces a multi-bit reference signal S19 identical with one of the multi-bit output signals S16 and S17, and the multi-bit reference signal S19 is valid in the presence of the enable signal S18.

The comparing unit 16 is responsive to the enable signal S18, and compares the multi-bit output signal S15 with the multi-bit reference signal S19 in the presence of the enable signal S18. The comparing unit 16 produces a resultant signal S20 indicative of consistency or inconsistency between the multi-bit output signal S15 and the multi-bit reference signal S19, and the resultant signal S20 is supplied to the diagnosis unit 17. However, the comparing unit 16 fixes the resultant signal S20 to a predetermined level indicative of the consistency in the absence of the enable signal S18.

The diagnosis unit 17 monitors the resultant signal S20 to see whether or not the resultant signal S20 is continuously indicative of the consistency over the test operation. Namely, if the resultant signal S20 is indicative of the consistency over all of the first and second random test patterns, the diagnosis unit 17 produces a diagnosis signal S21 indicative of an acceptable logic gate. However, if the resultant signal S20 indicative of the inconsistency is supplied to the diagnosis unit 17 on the basis of at least one of the first random test patterns, the diagnosis unit 17 shifts the diagnosis signal S21 so as to inform an analyst of a defective product.

Description is hereinbelow made on a method of testing a logic gate. The method starts with preparation of the known good logic gates 14b and 14c and a suspect logic gate 14a. The pattern generating unit 11 produces one of the first random test patterns and the second random test pattern having a "don't care" bit pattern, and supplies it to the known good logic gates 14b and 14c as well as to the suspect logic gate 14a for producing the multi-bit output signals S16, S17 and S15.

The logic unit 15 compares the multi-bit output signal S16 with the multi-bit output signal S17 to see whether or not these multi-bit output signals S 16 and S17 are consistent with each other. When the multi-bit output signals S16 and S17 are consistent with each other, the logic unit 15 produces the enable signal S18. However, the enable signal S18 is not produced in case of inconsistency.

The comparing unit 16 compares the multi-bit output signal S15 with the multi-bit reference signal S19 in the presence of the enable signal S18, and produces the resultant signal S20 indicative of the consistency or the inconsistency between the multi-bit output signal S15 and the multi-bit reference signal S19 depending upon result of comparison. However, the reference signal S19 is invalid in the absence of the enable signal S18, and the comparing unit 16 fixes the resultant signal S20 to the predetermined level indicative of the consistency. The resultant signal S20 is supplied to the diagnosis unit 17.

The generation of the random test pattern to the report to the diagnosis unit 17 are repeated until all of the first random test patterns and the second random test pattern are supplied to the known good logic gates 14b and 14c and the suspect logic gate 14a. Finally, the diagnosis unit 17 determines the suspect logic gate 14a to be acceptable if the resultant signal S20 is indicative of the consistency to all of the random test patterns.

However, if at least one of the first random test patterns is causative of the resultant signal S20 indicative of the inconsistency, the diagnosis unit 17 informs the analyst of a defective product with the diagnosis signal S21.

As will be understood from the foregoing description, the testing apparatus according to the present invention judges the suspect logic gate 14a on the basis of the multi-bit output signal S15 produced from the first random test patterns with uniqueness only, and any acceptable product is never discarded as a detective product due to the second random test pattern. In other words, the testing apparatus according to the present invention exactly jdges suspect logic gates, and is conducive to increase of the production yield of the logic gate.

Second Embodiment

Figure 3:
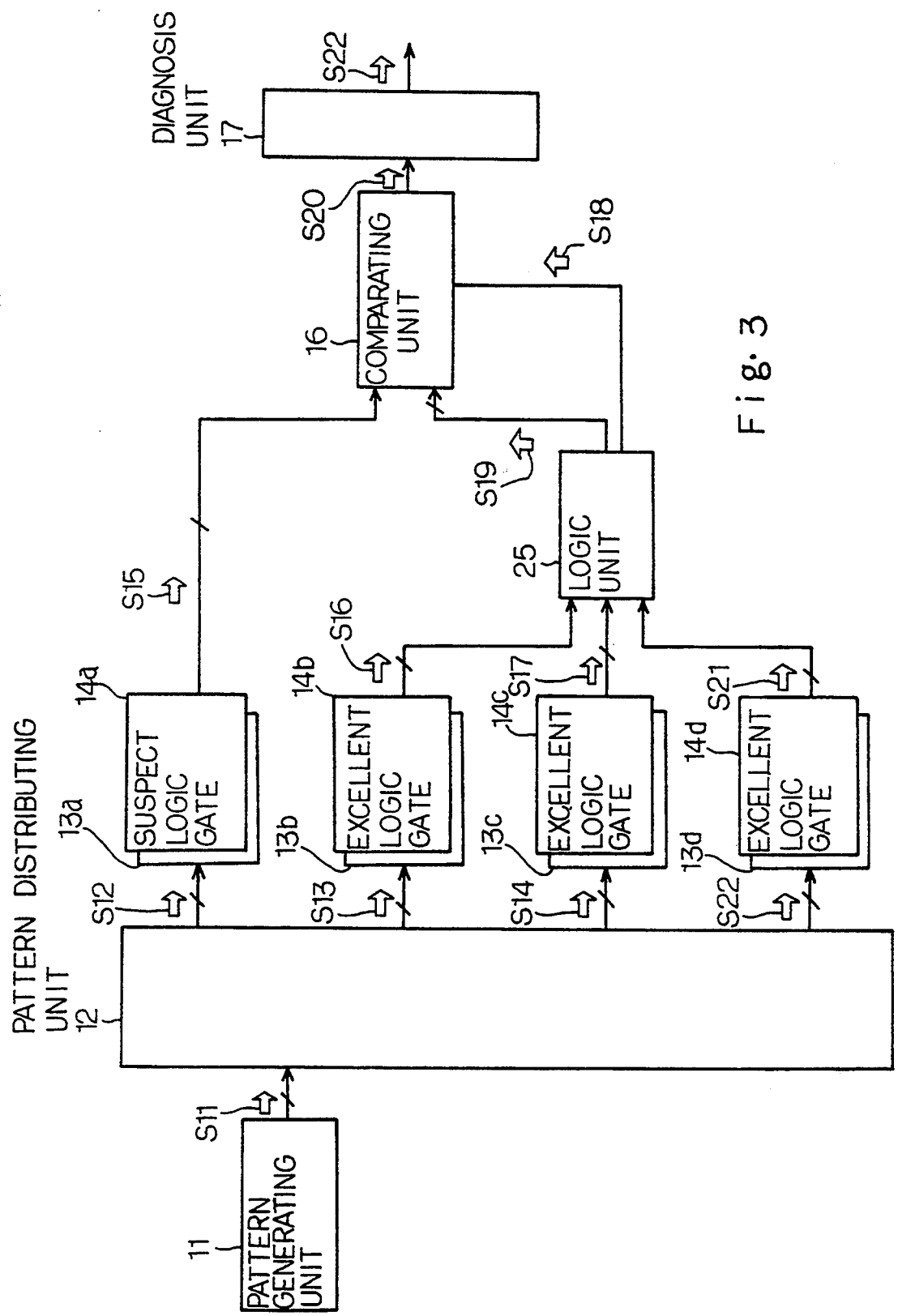
FIG. 3 is a block diagram showing the arrangement of another testing apparatus according to the present invention.

Turning to FIG. 3 of the drawings, another testing apparatus embodying the present invention is illustrated. The circuit components corresponding to those of the first embodiment are labeled with the same references as those used in FIG. 2 without detailed description for the sake of simplicity. The pattern distributing unit 12 is coupled with four test adapters 13a, 13b, 13c and 13d, and the test adapters 13b to 13d are respectively assigned to three known good logic gates 14b, 14c and 14d. The multi-bit output signals S16, S17 and S21 are supplied to the logic unit 25, and the logic gate 25 determines the multi-bit reference signal S19 through decision by majority. Namely, if at least two of the third are identical in logic level, the corresponding bit of the multi-bit reference signal S19 is determined to be equal to the two third. The comparing unit 16 compares the multi-bit output signal S15 with the multi-bit reference signal S19, and produces the resultant signal S20 indicative of consistency or inconsistency depending upon the result of comparison. However, the circuit behavior is similar to that of the first embodiment, and no further description is incorporated hereinbelow.

Although particular embodiments of the present invention have been shown and described, it will be obvious to those skilled in the art that various changes and modifications may be made without departing from the spirit and scope of the present invention. For example, the present invention is applicable to a testing apparatus for any integrated circuit in so far as random test patterns are used in the testing sequence.

What is claimed is:

1. A testing apparatus used for discriminating a defective integrated circuit from a known good integrated circuit, comprising:

a) a pattern generating unit operative to sequentially produce first random test patterns and at least one second random test pattern having a don't care bit pattern;

b) distributing unit coupled with at least first, second and third test adapters which are coupled to first and second known good integrated circuits and a suspect integrated circuit, respectively, said distributing unit being operative to sequentially transfer said first random test patterns and said at least one second random test pattern to said at least first, second and third test adapters so that said first and second known good integrated circuits and said suspect integrated circuit respectively produce first, second and third output signals;

c) a logic unit coupled to said first and second test adapters, and producing an enable signal indicative of application of each of said first random test patterns to said first and second known good integrated circuits as well as to said suspect integrated circuit when said first and second output signals are consistent with each other, said logic unit further producing a fourth output signal identical with one of said first and second output signals in the presence of said enable signal;

d) a comparator unit operative to compare said third output signal with said fourth output signal in the presence of said enable signal for producing a fifth output signal indicating whether said third and fourth output signals are consistent with each other depending upon a result of the comparison; and e) a diagnosis unit producing a diagnosis signal indicating that said suspect integrated ircuit is an acceptable integrated circuit when all of said first random test patterns result in said fifth output signal indicating that said third ad fourth output signals are consistent with each other.

2. A testing apparatus as set forth in claim 1, in which each of said first and second known good integrated circuits and said suspect integrated circuit is a logic gate.

3. A testing apparatus used for discriminating a defective integrated circuit from a known good integrated circuit, comprising:

a) a pattern generating unit operative to sequentially produce first random test patterns and at least one second random test pattern having a don't care bit pattern;

b) a distributing unit coupled with first, second, third and fourth test adapters which are coupled to first, second and third known good integrated circuits and a suspect integrated circuit, respectively, said distributing unit being operative to sequentially transfer said first random test patterns and said at least one second random test pattern to said first, second, third and fourth test adapters so that said first, second and third known good integrated circuits and said suspect integrated circuit respectively produce first, second, third and fourth output signals;

c) a logic unit coupled to said first, second and third test adapters, and producing a fifth output signal through a decision by majority on said first, second and third output signals;

d) a comparator Unit operative to compare said fourth output signal with said fifth output signal for producing a sixth output signal indicating whether said fourth and fifth output signals are consistent with each other depending upon result of the comparison; and e) a diagnosis unit producing a diagnosis signal indicting that said suspect integrated circuit is an acceptable integrated circuit when all of said first random test patterns result in said sixth output signal indicating that said ourth and fifth output signals are consistent with each other.

4. A method of testing an integrated circuit to determing whether or not said integrated circuit is either defective or acceptable, comprising the steps of:

a) preparing at least first and second known good integrated circuits and a suspect integrated circuit through an integrated circuit fabrication process;

b) supplying one of a test pattern selected from a group consisting of first random test patterns and at least one second random test pattern having a don't care bit pattern to said at least first and second known good integrated circuits as well as to said suspect integrated circuit to produce first, second and third output signals;

c) comparing said first output signal with said second output signal to determine whether or not said first and second output signals are consistent with each other;

d) producing an enable signal when said first and second output signals are consistent with each other;

e) comparing said third output signal with a reference signal identical with either said first or second output signal in the presence of said enable signal;

f) producing a resultant signal indicating whether said third output signal and said reference signal are consistent with each other depending upon a result of the comparison;

g) repeating said steps b) to f) until all of said first random test patterns and said at least one second random test pattern are supplied to said first and second known good integrated circuits and said suspect integrated circuit; and h) determining said suspect integrated circuit to be acceptable when all of said first random test patterns result in said resultant signal indicating that said third output signal and said reference signal are consistent with each other.

* * * * *

UNITED STATES PATENT AND TRADEMARK OFFICE
CERTIFICATE OF CORRECTION

PATENT NO. : 5,392,298
DATED : February 21, 1995
INVENTOR(S) : Keisuke SHINJO

It is certified that error appears in the above-indentified patent and that said Letters Patent is hereby corrected as shown below:

Column 2, line 3, after "are" insert --not--.
Column 6, line 13, delete "jdges" and insert --judges--.
Column 7, line 19, delete "ad" and insert --and--.

Column 7, line 48, delete "Unit" and insert --unit--.
Column 8, line 9, delete "ourth" and insert --fourth--.

Signed and Sealed this

Fifteenth Day of October, 1996

*Attest:*

BRUCE LEHMAN

*Attesting Officer*     Commissioner of Patents and Trademarks